(12) United States Patent
Zheng et al.

(10) Patent No.: US 10,944,508 B2
(45) Date of Patent: Mar. 9, 2021

(54) DATA PROCESSING METHOD AND COMMUNICATIONS DEVICE

(71) Applicant: Huawei Technologies Co., Ltd., Shenzhen (CN)

(72) Inventors: Chen Zheng, Shanghai (CN); Liang Ma, Shanghai (CN); Xin Zeng, Shenzhen (CN); Xiaojian Liu, Shenzhen (CN); Yuejun Wei, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 8 days.

(21) Appl. No.: 16/533,343

(22) Filed: Aug. 6, 2019

(65) Prior Publication Data

US 2019/0363827 A1 Nov. 28, 2019

Related U.S. Application Data

(63) Continuation of application No. PCT/CN2018/075220, filed on Feb. 5, 2018.

(30) Foreign Application Priority Data

Feb. 6, 2017 (CN) .......................... 2017 1 0065839

(51) Int. Cl.
*H04L 1/00* (2006.01)
*H03M 13/25* (2006.01)

(52) U.S. Cl.
CPC ........ *H04L 1/0057* (2013.01); *H03M 13/255* (2013.01); *H04L 1/0068* (2013.01)

(58) Field of Classification Search
CPC ... H04L 1/0057; H04L 1/0068; H03M 13/255
See application file for complete search history.

(56) References Cited

U.S. PATENT DOCUMENTS 10,804,933 B2 * 10/2020 Kim ..................... H04L 1/0041
2008/0320353 A1 12/2008 Blankenship et al.
(Continued)

FOREIGN PATENT DOCUMENTS

| CN | 101034953 A | 9/2007 |
| CN | 102308577 B | 7/2015 |
| EP | 2222008 B1 | 2/2013 |

OTHER PUBLICATIONS

English Translation of the International Search Report, International Application No. PCT/CN2018/075220, PCT, State Intellectual Property Office of the P.R. China, pp. 1-2, dated Sep. 8, 2018. (Year: 2018).*

(Continued)

*Primary Examiner* — Kyle Vallecillo
(74) *Attorney, Agent, or Firm* — Leydig, Voit & Mayer, Ltd.

(57) ABSTRACT

This application provides a data processing method and a communications device. The data processing method includes: determining, by a first communications device, $N_{CB}$, based on a size of the circular buffer of the communications device and an information processing capability of a second communications device; and obtaining, by the first communications device, a second encoded bit segment from a first encoded bit segment having a length of $N_{CB}$. According to the data processing method and the communications device provided in this application, decoding complexity of the communications device can be reduced and communication reliability can be improved.

20 Claims, 7 Drawing Sheets

(56) References Cited

U.S. PATENT DOCUMENTS

| | | | | |
|---|---|---|---|---|
| 2010/0281331 | A1* | 11/2010 | Hammons, Jr. | H04L 1/1812 |
| | | | | 714/752 |
| 2012/0173948 | A1 | 7/2012 | Myung et al. | |
| 2017/0149528 | A1* | 5/2017 | Kim | H03M 13/1102 |
| 2018/0234114 | A1* | 8/2018 | Soriaga | H04L 1/0057 |
| 2019/0013901 | A1* | 1/2019 | Nimbalker | H04L 1/0067 |
| 2019/0052290 | A1* | 2/2019 | Andersson | H03M 13/116 |
| 2019/0207710 | A1* | 7/2019 | Ye | H04L 1/0069 |
| 2019/0229751 | A1* | 7/2019 | Kim | H03M 13/11 |
| 2020/0228254 | A1* | 7/2020 | Ma | H04L 1/00 |
| 2020/0235752 | A1* | 7/2020 | Sandberg | H03M 13/6508 |
| 2020/0235759 | A1* | 7/2020 | Ye | H03M 13/116 |

OTHER PUBLICATIONS

English Translation of the Written Opinion of the International Searching Authority, International Application No. PCT/CN2018/075220, PCT, State Intellectual Property Office of the P.R. China, pp. 1-4, dated Mar. 6, 2019. (Year: 2019).*

"LDPC HARQ design," 3GPP TSG RAN WG1 Ad hoc, Spokane, USA, R1-1700384, XP051202862, pp. 1-2, 3rd Generation Partnership, Project, Valbonne, France (Jan. 16-20, 2017).

Gallager, "Low Density Parity-Check Codes," IRE Transactions on Information Theory, pp. 21-28 (Jan. 1962).

"Proposal for Limited Buffer Rate Matching," 3GPP TSG RAN #51, Jeju, Korea, R1-075106, XP050108532, pp. 1-3, 3rd Generation Partnership, Project, Valbonne, France (Nov. 5-9, 2007).

"3rd Generation Partnership Project; Technical Specification Group Radio Access Network; Evolved Universal Terrestrial Radio Access (E-UTRA); Multiplexing and channel coding (Release 13)," 3GPP TS 36.212 V13.0.0, XP051047448, pp. 1-121, 3rd Generation Partnership, Project, Valbonne, France (Dec. 2015).

* cited by examiner

DATA PROCESSING METHOD AND COMMUNICATIONS DEVICE

CROSS-REFERENCE TO RELATED APPLICATIONS

This application is a continuation of International Application No. PCT/CN2018/075220, filed on Feb. 5, 2018, which claims priority to Chinese Patent Application No. 201710065839.7, filed on Feb. 6, 2017. The disclosures of the aforementioned applications are hereby incorporated by reference in their entireties.

TECHNICAL FIELD

Embodiments of this application relate to the communications field, and more specifically, to a data processing method and a communications device.

BACKGROUND

In a communications system, information data is transmitted between a sending device (for example, a base station or a terminal) and a receiving device (for example, a terminal or a base station). This is susceptible to interference and errors due to a complex and changeable radio propagation environment. To reliably send the information data, the sending device performs processing such as CRC parity check, channel encoding, rate matching, and interleaving on the information data, maps interleaved encoded bits to modulated symbols, and sends the modulated symbols to the receiving device. After receiving the modulated symbols, the receiving device correspondingly restores the modulated symbols to the information data through de-interleaving, rate de-matching, decoding, and CRC parity check. These processes can reduce transmission errors and improve data transmission reliability.

A low-density parity-check (LDPC) code denotes a family of linear block codes each with a sparse parity check matrix, and characterized by a flexible structure and low decoding complexity. The LDPC code uses a partially parallel iterative decoding algorithm, and therefore has higher throughput than a conventional Turbo code. The LDPC code is considered as a next-generation error-correcting code in the communications system, may be used to improve channel transmission reliability and power utilization, and may be widely applied to space communication, fiber optical communication, a personal communications system, an ADSL, a magnetic recording device, and the like. Currently, that the LDPC code has been considered as one of channel encoding schemes in a new radio (NR) communications technology.

An LDPC code sent by the sending device to the receiving device has a specific code rate. The code rate is related to an information processing capability of the receiving device. To improve communication reliability, the sending device should be capable of sending information of different code rates to receiving devices having different information processing capabilities.

SUMMARY

This application provides a data processing method and a communications device, to improve communication reliability.

According to a first aspect, a data processing method is provided. The data processing method includes: determining, by a first communications device, $N_{CB}$, where $N_{CB}$ is determined based on $N_{CB,max}$, $N_{IR}$, $K_W$, and C, $N_{CB,max}$ is a size of a maximum coded block supported by a decoder of a second communications device, $N_{IR}$ is a size of a soft information buffer of the second communications device, $K_W$ is a size of a circular buffer of the first communications device, and C is a quantity of code blocks in a transport block of information transmitted by the first communications device to the second communications device; and obtaining, by the first communications device, a second encoded bit segment from the first encoded bit segment having a length of $N_{CB}$.

In the data processing method, for each second communications device, the second encoded bit segment is obtained from the first encoded bit segment, and the length $N_{CB}$ of the first encoded bit segment is determined based on the size of the circular buffer of the first communications device and an information processing capability of the second communications device. In this way, when the second encoded bit segment is sent to the second communications device, storage cost and decoding complexity of the second communications device can be reduced.

For a plurality of second communications devices, sizes of first encoded bit segments corresponding to different second communications devices are respectively determined based on information processing capabilities of the different second communications devices. Therefore, communication reliability can be improved.

In a possible implementation, $$N_{CB} = \min\left(K_W, N_{CB,max}, \left\lfloor \frac{N_{IR}}{C} \right\rfloor\right).$$

In a possible implementation, the first encoded bit segment is an encoded bit segment having a length of $N_{CB}$ in a third encoded bit segment, and the third encoded bit segment includes information bits that cannot be punctured.

In a possible implementation, the first encoded bit segment is an encoded bit segment having a length of $N_{CB}$ in a third encoded bit segment, the third encoded bit segment includes to-be-punctured information bits, the to-be-punctured information bits are located at a tail of the third encoded bit segment, the first encoded bit segment is located at beginning of the third encoded bit segment, and the first encoded bit segment includes some of the to-be-punctured information bits.

In this implementation, the first encoded bit segment is located at a front end of the third encoded bit segment, and the to-be-punctured information bits are located at a tail end of the third encoded bit segment. Compared with a case in which a to-be-punctured information bit segment is not located at a tail end, in this implementation, a first encoded bit segment having a same length may include fewer to-be-punctured information bits, thereby reducing decoding complexity of the second communications device.

In a possible implementation, the first encoded bit segment is an encoded bit segment having a length of $N_{CB}$ in a third encoded bit segment, the third encoded bit segment includes to-be-punctured information bits, the to-be-punctured information bits are located at a tail of the third encoded bit segment, the first encoded bit segment is located at beginning of the third encoded bit segment, and the first encoded bit segment does not include any to-be-punctured information bit.

In this implementation, the first encoded bit segment is located at a front end of the third encoded bit segment, and the to-be-punctured information bits are located at a tail end of the third encoded bit segment. In addition, the length of the first encoded bit segment is less than or equal to a length of a bit segment in the third encoded bit segment except a to-be-punctured bit segment. In this way, the first encoded bit segment may not include any to-be-punctured information bit, thereby reducing decoding complexity of the second communications device.

In a possible implementation, the obtaining, by the first communications device, a second encoded bit segment from the first encoded bit segment having a length of $N_{CB}$ includes: determining, by the first communications device, a first starting position S in the first encoded bit segment; and obtaining, by the first communications device as the second encoded bit segment, an encoded bit segment having a length of n from the first starting position S in the first encoded bit segment.

In a possible implementation, the data processing method further includes: sending, by the first communications device, the second encoded bit segment to the second communications device.

In a possible implementation, the second encoded bit segment is a bit segment obtained through low-density parity-check LDPC encoding.

According to a second aspect, a data processing method is provided. The data processing method includes: determining, by a first communications device, $N_{CB}$ based on an information processing capability of a second communications device; and obtaining, by the first communications device, a second encoded bit segment from a first encoded bit segment having a length of $N_{CB}$, where the first encoded bit segment is an encoded bit segment having a length of $N_{CB}$ in a third encoded bit segment, and the third encoded bit segment includes information bits that cannot be punctured.

In the data processing method, because the third encoded bit segment includes information bits that cannot be punctured, none of information bits included in both the first encoded bit segment and the second encoded bit segment can be punctured, thereby reducing decoding complexity of the second communications device.

In addition, the length of the first encoded bit segment is determined based on the information processing capability of the second communications device, thereby improving communication reliability.

In a possible implementation, the information processing capability of the second communications device includes a size $N_{CB,max}$ of a maximum coded block supported by a decoder of the second communications device and a size $N_{IR}$ of a soft information buffer of the second communications device, where $$N_{CB} = \min\left(K_W, N_{CB,max}, \left\lfloor \frac{N_{IR}}{C} \right\rfloor\right),$$

C is a quantity of code blocks in a transport block of information transmitted by the first communications device to the second communications device, and $K_W$ is a size of a circular buffer of the first communications device; or the information processing capability of the second communications device includes a size $N_{IR}$ of a soft information buffer of the second communications device, where $$N_{CB} = \min\left(K_W, \left\lfloor \frac{N_{IR}}{C} \right\rfloor\right),$$

C is a quantity of code blocks in a transport block of information transmitted by the first communications device to the second communications device, and $K_W$ is the size of the circular buffer of the first communications device; or the information processing capability of the second communications device includes a size $N_{CB,max}$ of a maximum coded block supported by a decoder of the second communications device, where $N_{CB} = \min(K_W, N_{CB,max})$, and $K_W$ is the size of the circular buffer of the first communications device.

In a possible implementation, the third encoded bit segment is a bit segment obtained through LDPC encoding.

In a possible implementation, the data processing method further includes: sending, by the first communications device, the second encoded bit segment to the second communications device.

According to a third aspect, a data processing method is provided. The data processing method includes: obtaining, by a second communications device, a second encoded bit segment, where the second encoded bit segment is obtained by a first communications device from a first encoded bit segment having a length of $N_{CB}$, $N_{CB}$ is determined by the first communications device based on $N_{CB,max}$, $N_{IR}$, $K_W$, and C, $N_{CB,max}$ is a size of a maximum coded block supported by a decoder of the second communications device, $N_{IR}$ is a size of a soft information buffer of the second communications device, $K_W$ is a size of a circular buffer of the first communications device, and C is a quantity of code blocks in a transport block of information transmitted by the first communications device to the second communications device; combining and saving, by the second communications device, soft bits of the second encoded bit segment in a soft information buffer of the second communications device; and performing, by the second communications device, decoding based on the soft information buffer.

In the data processing method, the length of the first encoded bit segment to which the second encoded bit segment belongs is determined based on $N_{CB,max}$, $N_{IR}$, $K_W$, and C, so that the second communications device can receive soft information having a suitable length, thereby improving communication reliability and reducing decoding complexity of the second communications device.

In a possible implementation, $$N_{CB} = \min\left(K_W, N_{CB,max}, \left\lfloor \frac{N_{IR}}{C} \right\rfloor\right).$$

In a possible implementation, the first encoded bit segment is an encoded bit segment having a length of $N_{CB}$ in a third encoded bit segment, and the third encoded bit segment includes information bits that cannot be punctured.

In a possible implementation, the first encoded bit segment is an encoded bit segment having a length of $N_{CB}$ in a third encoded bit segment, the third encoded bit segment includes to-be-punctured information bits, the to-be-punctured information bits are located at a tail of the third encoded bit segment, the first encoded bit segment is located at beginning of the third encoded bit segment, and the first encoded bit segment includes some of the to-be-punctured information bits.

In this implementation, the first encoded bit segment is located at a front end of the third encoded bit segment, and the to-be-punctured information bits are located at a tail end of the third encoded bit segment. Compared with a case in which a to-be-punctured information bit is not located at a tail end, in this implementation, a first encoded bit segment having a same length may include fewer to-be-punctured information bits, thereby reducing decoding complexity of the second communications device.

In a possible implementation, the first encoded bit segment is an encoded bit segment having a length of $N_{CB}$ in a third encoded bit segment, the third encoded bit segment includes to-be-punctured information bits, the to-be-punctured information bits are located at a tail of the third encoded bit segment, the first encoded bit segment is located at beginning of the third encoded bit segment, and the first encoded bit segment does not include any to-be-punctured information bit.

In this implementation, the first encoded bit segment is located at a front end of the third encoded bit segment, and the to-be-punctured information bits are located at a tail end of the third encoded bit segment. In addition, the length of the first encoded bit segment is less than or equal to a length of a bit segment in the third encoded bit segment except a to-be-punctured bit segment. In this way, the first encoded bit segment may not include any to-be-punctured information bit, thereby reducing decoding complexity of the second communications device.

In a possible implementation, the obtaining, by the first communications device, a second encoded bit segment from the first encoded bit segment having a length of $N_{CB}$ includes: determining, by the first communications device, a first starting position S in the first encoded bit segment; and obtaining, by the first communications device as the second encoded bit segment, an encoded bit segment having a length of n from the first starting position S in the first encoded bit segment.

In a possible implementation, the second encoded bit segment is a bit segment obtained through low-density parity-check LDPC encoding.

In a possible implementation, the obtaining, by a second communications device, a second encoded bit segment includes: receiving, by the second communications device, the second encoded bit segment sent by the first communications device.

According to a fourth aspect, a data processing method is provided. The data processing method includes: receiving, by a second communications device, a second encoded bit segment sent by a first communications device, where the second encoded bit segment is obtained by the first communications device from a first encoded bit segment having a length of $N_{CB}$, the first encoded bit segment is an encoded bit segment having a length of $N_{CB}$ in a third encoded bit segment, the third encoded bit segment includes information bits that cannot be punctured, and $N_{CB}$ is determined based on an information processing capability of the second communications device; combining and saving, by the second communications device, soft bits of the second encoded bit segment in a soft information buffer of the second communications device; and performing, by the second communications device, decoding based on the soft information buffer.

In the data processing method, because the third encoded bit segment includes information bits that cannot be punctured, information bits included in both the first encoded bit segment and the second encoded bit segment cannot be punctured either, thereby reducing decoding complexity of the second communications device.

In addition, the length of the first encoded bit segment is determined based on the information processing capability of the second communications device, thereby improving communication reliability.

In a possible implementation, the information processing capability of the second communications device includes a size $N_{CB,max}$ of a maximum coded block supported by a decoder of the second communications device and a size $N_{IR}$ of the soft information buffer of the second communications device, where $$N_{CB} = \min\left(K_W, N_{CB,max}, \left\lfloor \frac{N_{IR}}{C} \right\rfloor\right),$$

C is a quantity of code blocks in a transport block of information transmitted by the first communications device to the second communications device, and $K_W$ is a size of a circular buffer of the first communications device; or the information processing capability of the second communications device includes a size $N_{IR}$ of the soft information buffer of the second communications device, where $$N_{CB} = \min\left(K_W, \left\lfloor \frac{N_{IR}}{C} \right\rfloor\right),$$

C is a quantity of code blocks in a transport block of information transmitted by the first communications device to the second communications device, and $K_W$ is the size of the circular buffer of the first communications device; or the information processing capability of the second communications device includes a size $N_{CB,max}$ of a maximum coded block supported by a decoder of the second communications device, where $N_{CB}=\min(K_W, N_{CB,max})$ and $K_W$ is the size of the circular buffer of the first communications device.

In a possible implementation, the third encoded bit segment is a bit segment obtained through LDPC encoding.

In a possible implementation, the obtaining, by a second communications device, a second encoded bit segment includes: receiving, by the second communications device, the second encoded bit segment sent by the first communications device.

According to a fifth aspect, a communications device is provided. The communications device includes a module configured to perform the data processing method according to the first aspect or any possible implementation of the first aspect.

According to a sixth aspect, a communications device is provided. The communications device includes a module configured to perform the data processing method according to the second aspect or any possible implementation of the second aspect.

According to a seventh aspect, a communications device is provided. The communications device includes a module configured to perform the data processing method according to the third aspect or any possible implementation of the third aspect.

According to an eighth aspect, a communications device is provided. The communications device includes a module configured to perform the data processing method according to the fourth aspect or any possible implementation of the fourth aspect.

According to a ninth aspect, a communications device is provided. The communications device includes a processor, and optionally, may further include a receiver and a transmitter. The processor is configured to execute code. When the code is executed, the processor implements the data processing method according to the first aspect or any possible implementation of the first aspect.

According to a tenth aspect, a communications device is provided. The communications device includes a processor, and optionally, may further include a receiver and a transmitter. The processor is configured to execute code. When the code is executed, the processor implements the data processing method according to the second aspect or any possible implementation of the second aspect.

According to an eleventh aspect, a communications device is provided. The communications device includes a processor, and optionally, may further include a receiver and a transmitter. The processor is configured to execute code. When the code is executed, the processor implements the data processing method according to the third aspect or any possible implementation of the third aspect.

According to a twelfth aspect, a communications device is provided. The communications device includes a processor, and optionally, may further include a receiver and a transmitter. The processor is configured to execute code. The processor is configured to execute code. When the code is executed, the processor implements the data processing method according to the fourth aspect or any possible implementation of the fourth aspect.

According to a thirteenth aspect, a computer-readable medium is provided. The computer-readable medium stores program code to be executed by a communications device. The program code includes an instruction used to perform the data processing method according to the first aspect or any possible implementation of the first aspect.

According to a fourteenth aspect, a computer-readable medium is provided. The computer-readable medium stores program code to be executed by a communications device. The program code includes an instruction used to perform the data processing method according to the second aspect or any possible implementation of the second aspect.

According to a fifteenth aspect, a computer-readable medium is provided. The computer-readable medium stores program code to be executed by a communications device. The program code includes an instruction used to perform the data processing method according to the third aspect or any possible implementation of the third aspect.

According to a sixteenth aspect, a computer-readable medium is provided. The computer-readable medium stores program code to be executed by a communications device. The program code includes an instruction used to perform the data processing method according to the fourth aspect or any possible implementation of the fourth aspect.

According to a seventeenth aspect, a computer program product including an instruction is provided. When the computer program product is run on a communications device, the communications device is enabled to perform the data processing method according to the first aspect or any possible implementation of the first aspect.

According to an eighteenth aspect, a computer program product including an instruction is provided. When the computer program product is run on a communications device, the communications device is enabled to perform the data processing method according to the second aspect or any possible implementation of the second aspect.

According to a nineteenth aspect, a computer program product including an instruction is provided. When the computer program product is run on a communications device, the communications device is enabled to perform the data processing method according to the third aspect or any possible implementation of the third aspect.

According to a twentieth aspect, a computer program product including an instruction is provided. When the computer program product is run on a communications device, the communications device is enabled to perform the data processing method according to the fourth aspect or any possible implementation of the fourth aspect.

According to a twenty-first aspect, a data processing method is provided. The data processing method includes: interleaving, by a first communications device, a first encoded bit segment, so that to-be-punctured information bits in the first encoded bit segment are located at a tail end of the first encoded bit segment, and the first encoded bit segment is obtained through LDPC encoding; determining, by the first communications device, a second encoded bit segment having a length of $N_{CB}$ from the first encoded bit segment, where $N_{CB}$ is determined based on an information processing capability of a second communications device; obtaining, by the first communications device, a third encoded bit segment from the second encoded bit segment; and sending, by the first communications device, the third encoded bit segment to the second communications device.

In the data processing method, although the first encoded bit segment includes the to-be-punctured information bits, the to-be-punctured information bits are located at the tail end of the first encoded bit segment. In this way, when the second encoded bit segment is determined from the first encoded bit segment, fewer to-be-punctured information bits may be included, thereby reducing decoding complexity of the second communications device.

In addition, a length of the third encoded bit segment is determined based on the information processing capability of the second communications device, thereby improving communication reliability.

In a possible implementation, the information processing capability of the second communications device includes a size $N_{CB,max}$ of a maximum coded block supported by a decoder of the second communications device and a size $N_{IR}$ of a soft information buffer of the second communications device, where $$N_{CB} = \min\left(K_W, N_{CB,max}, \left\lfloor \frac{N_{IR}}{C} \right\rfloor\right),$$

C is a quantity of code blocks in a transport block of information transmitted by the first communications device to the second communications device, and $K_W$ is a size of a circular buffer of the first communications device; or the information processing capability of the second communications device includes a size $N_{IR}$ of a soft information buffer of the second communications device, where $$N_{CB} = \min\left(K_W, \left\lfloor \frac{N_{IR}}{C} \right\rfloor\right),$$

C is a quantity of code blocks in a transport block of information transmitted by the first communications device to the second communications device, and $K_W$ is the size of the circular buffer of the first communications device; or the information processing capability of the second communications device includes a size $N_{CB,max}$ of a maximum coded block supported by a decoder of the second communications device, where $N_{CB}=\min(K_W, N_{CB,max})$, and $K_W$ is the size of the circular buffer of the first communications device.

According to a twenty-second aspect, a communications device is provided. The communications device includes a module configured to perform the data processing method according to the twenty-first aspect or the possible implementation of the twenty-first aspect.

According to a twenty-third aspect, a communications device is provided. The communications device includes a processor, and optionally, may further include a receiver and a transmitter. The processor is configured to execute code. The processor is configured to execute code. When the code is executed, the processor implements the data processing method according to the twenty-first aspect or the possible implementation of the twenty-first aspect.

According to a twenty-fourth aspect, a computer-readable medium is provided. The computer-readable medium stores program code to be executed by a communications device. The program code includes an instruction used to perform the data processing method according to the twenty-first aspect or the possible implementation of the twenty-first aspect.

According to a twenty-fifth aspect, a computer program product including an instruction is provided. When the computer program product is run on a communications device, the communications device is enabled to perform the data processing method according to the twenty-first aspect or the possible implementation of the twenty-first aspect.

DESCRIPTION OF EMBODIMENTS

The following describes the technical solutions in the embodiments of this application with reference to the accompanying drawings in the embodiments of this application.

Figure 1:
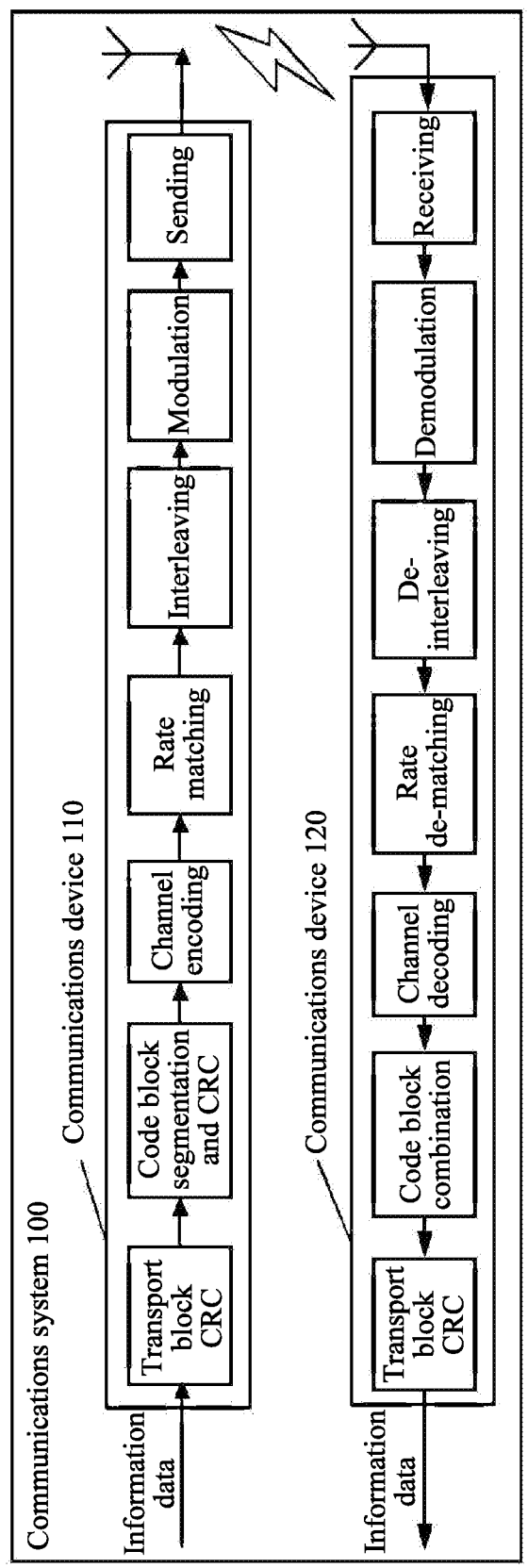
FIG. 1 is a schematic architectural diagram of a communications system that can apply a data processing method and a communications device according to embodiments of this application.

A communications system 100 shown in FIG. 1 includes a communications device 110 and a communications device 120.

When sending information data, the communications device 110 may divide the information data into a plurality of transport blocks (TB) based on a supported transport block size, and CRC parity bits are attached to each transport block. If a size of a transport block obtained after the parity bits is attached exceeds a maximum code block length, the transport block needs to be segmented into several code blocks (CB), code block CRC parity bits may be further attached to each code block, and one or more filler bits may also be added. The communications device 110 performs channel encoding, for example, LDPC encoding, on each code block to obtain a corresponding coded block. Each coded block includes a plurality of information bits in a code block and parity bits generated through encoding, which are referred to as encoded bits.

A coded block is saved in a circular buffer of the communications device 110 after sub-block interleaving. The communications device 110 selects an encoded bit segment from the circular buffer. To be specific, an encoded bit segment is interleaved, and is mapped to modulated symbols for sending. When performing re-transmission, the communications device 110 selects another encoded bit segment from the circular buffer for sending. If all data in the circular buffer has been transmitted, selection is performed on encoded bits from the beginning of the circular buffer.

After demodulating and de-interleaving received modulated symbols, the communications device 120 saves soft values of a received encoded bit segment at a corresponding position in a soft information buffer (soft buffer). If re-transmission occurs, the communications device 120 combines soft values of an encoded bit segment in each transmission and saves the combined soft values, in the soft information buffer. Herein, the combination means that if positions of two received encoded bits are the same, soft values of the two received encoded bits are combined. The communications device 120 decodes all soft values in the soft information buffer, to obtain a code block of the information data.

It should be noted that in the embodiments of this application, the communications device 110 may be a network device in the communications system, for example, a base station. Correspondingly, the communications device 120 may be a terminal. For ease of understanding, some nouns used in this application are described below.

In this application, nouns "network" and "system" are often interchangeably used, but a person skilled in the art can understand meanings thereof.

A terminal is a device having a communication function, and may include a handheld device having a wireless communication function, an in-vehicle device, a wearable device, a computing device, another processing device connected to a wireless modem, or the like. The terminal may have different names in different networks, for example, user equipment, a mobile station, a subscriber unit, a station, a cellular phone, a personal digital assistant, a wireless modem, a wireless communications device, a handheld device, a laptop computer, a cordless phone, or a wireless local loop station. For ease of description, the terminal is used for short in this application.

A base station (BS), also referred to as a base station device, is a device connecting the terminal to a wireless network, and includes but is not limited to a transmission reception point (TRP), an evolved NodeB (eNB), a radio network controller (RNC), a NodeB (NB), a base station controller (BSC), a base transceiver station (BTS), a home base station (for example, home evolved NodeB, or home NodeB, HNB), a baseband unit (BBU), a Wi-Fi access point (AP), or the like.

Figure 2:
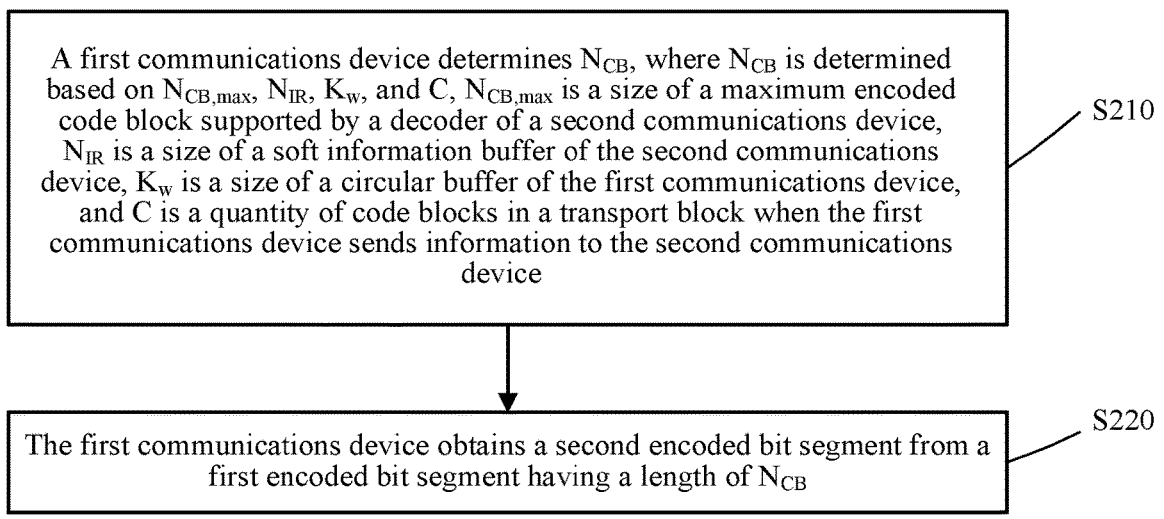
FIG. 2 is a schematic flowchart of a data processing method according to an embodiment of this application.

FIG. 2 is a schematic flowchart of a data processing method according to an embodiment of this application. It should be understood that FIG. 2 shows steps or operations of the data processing method, but the steps or operations are merely examples. In this embodiment of this application, other operations or variants of the operations in FIG. 2 may be further performed.

S210. A first communications device determines $N_{CB}$, where $N_{CB}$ is determined based on $N_{CB,max}$, $N_{IR}$, $K_W$, and $C$, $N_{CB,max}$ is a size of a maximum coded block supported by a decoder of a second communications device, $N_{IR}$ is a size of a soft information buffer of the second communications device, $K_W$ is a size of a circular buffer of the first communications device, and $C$ is a quantity of code blocks in a transport block of information transmitted by the first communications device to the second communications device.

$N_{IR}$ may be a size of a buffer used to store soft information of a transport block. The transport block herein may be a transport block transmitted between the first communications device and the second communications device. $K_W$ may be a size of a circular buffer for a code block.

The first communications device may be the communications device 110 shown in FIG. 1.

$N_{CB}$ may be a size of a soft information buffer actually used when the second communications device receives the information sent by the first communications device. The circular buffer of the first communications device may also be referred to as a virtual buffer, used to store an encoded bit obtained through encoding by the first communications device, for example, through LDPC encoding.

The second communications device may be the communications device 120 shown in FIG. 1.

$N_{IR}$ and $N_{CB,max}$ may be referred to as information processing capabilities of the second communications device. Different values of the information processing capabilities may be denoted by different levels of the second communications device. For example, the processing capability of the second communications device is the size $N_{IR}$ of the soft information buffer of the second communications device. If a level of the second communications device is 1, the size $N_{IR}$ of the soft information buffer of the second communications device is 250000 bits, or if a level is 2, the size $N_{IR}$ of the soft information buffer is 1000000 bits. It should be noted that the foregoing is merely for ease of example, and this application is not limited thereto.

The processing capability of the second communications device may further include a size of a register, a capability of the decoder, and the like.

If the processing capability of the second communications device is limited, when initially transmitting or re-transmitting a second encoded bit segment, the first communications device determines a size of an coded block based on the processing capability of the second communications device, and selects a to-be-sent encoded bit segment, thereby reducing storage overheads and decoding complexity of the second communications device and improving communication reliability.

S220. The first communications device obtains a second encoded bit segment from a first encoded bit segment having a length of $N_{CB}$.

In other words, the first communications device may obtain the second encoded bit segment from the first encoded bit segment having the length of $N_{CB}$ in the circular buffer.

In the data processing method, for each second communications device, the second encoded bit segment is obtained from the first encoded bit segment, and the length $N_{CB}$ of the first encoded bit segment is determined based on the size of the circular buffer of the first communications device and an information processing capability of the second communications device. In this way, when the second bit segment is sent to the second communications device, storage overheads and decoding complexity of the second communications device can be reduced.

For a plurality of second communications devices, sizes of first encoded bit segments corresponding to different second communications devices are respectively determined based on information processing capabilities of the different second communications devices. Therefore, communication reliability can be improved.

In this embodiment of this application, the second encoded bit segment obtained from the first encoded bit segment may not include any filler bit. For example, when obtaining the second encoded bit segment from the first encoded bit segment, the first communications device may read only a valid bit in the first encoded bit segment, and skip a filler bit (for example, a bit whose value is NULL).

In this embodiment of this application, that "$N_{CB}$ is determined based on $N_{CB,max}$, $N_{IR}$, $K_W$, and $C$" may specifically include $$N_{CB} = \min\left(K_W, N_{CB,max}, \left\lfloor \frac{N_{IR}}{C} \right\rfloor\right),$$

where $\lfloor \bullet \rfloor$ means rounding down to an integer, and min (.) means that a minimum value is used for elements in parentheses.

It can be learned that a size of the first encoded bit segment is less than or is equal to the size of the circular buffer of the first communications device.

In the data processing method in this embodiment of this application, the first encoded bit segment may be a bit segment in the third encoded bit segment. The first communications device may be configured to send a data transport block, for example, a first transport block, where the first transport block may be segmented into at least one code block. The third encoded bit segment may be obtained by the first communications device by processing one code block, such as a first code block, in the first transport block based on the processing capability of the second communications device.

Specifically, the third encoded bit segment may be bits obtained by performing LDPC encoding and other processing on an information sequence.

An LDPC base matrix or an LDPC parity check matrix used for the LDPC encoding may include a type of special columns, and information bits obtained through encoding based on the special columns can be punctured. The special columns in the LDPC base matrix or the LDPC parity check matrix may be referred to as puncture columns.

For example, the first communications device encodes the first code block by using the LDPC base matrix or the LDPC parity check matrix to obtain the third encoded bit segment. The first communications device may directly save the third encoded bit segment into the circular buffer, or may save the third encoded bit segment in the circular buffer after deleting to-be-punctured information bits (where the to-be-punctured information bits may be referred to as a first to-be-punctured bit segment) in the third encoded bit segment, that is, the third encoded bit segment saved in the circular buffer does not include the first to-be-punctured bit segment; or may save, in the circular buffer, the third encoded bit segment including to-be-punctured information bits, and then interleave the to-be-punctured information bits in the third encoded bit segment saved in the circular buffer with a tail end of the third encoded bit segment.

If the third encoded bit segment does not include the to-be-punctured information bits, the first encoded bit segment determined from the third encoded bit segment does not include to-be-punctured information bits either, and correspondingly, the second encoded bit segment does not include to-be-punctured information bits either. In this way, after the second communications device receives the second encoded bit segment, decoding complexity can be reduced.

If the third encoded bit segment includes the to-be-punctured information bits, but the to-be-punctured information bits have been interleaved with the tail end of the third encoded bit segment, when the first encoded bit segment is determined from a front end of the third encoded bit segment, the first encoded bit segment may not include to-be-punctured information bits, for example, when the length $N_{CB}$ of the first encoded bit segment is less than $K_W-P$, where P is a quantity of to-be-punctured information bits included in the first to-be-punctured bit segment. Alternatively, the first encoded bit segment may include only a part of the first to-be-punctured bit segment, for example, the length $N_{CB}$ of the first encoded bit segment is greater than $K_W-P$.

If the third encoded bit segment includes the to-be-punctured information bits, and the to-be-punctured information bits are located at a front end of the third encoded bit segment, the first encoded bit segment may include to-be-punctured information bits. However, when the second encoded bit segment is obtained from the first encoded bit segment for the first time, the to-be-punctured information bit can be skipped. During re-transmission, the second encoded bit segment may include or may not include to-be-punctured information bits.

In this embodiment of this application, when obtaining the second encoded bit segment from the first encoded bit segment having the length of $N_{CB}$, the first communications device may first determine a redundancy version RV for transmission, then determine a starting position S of the to-be-obtained second encoded bit segment in the first encoded bit segment based on the redundancy version RV, and obtain the second encoded bit segment having a length of n from the starting position S in the first encoded bit segment, where n is an integer greater than 0.

The data processing method in this embodiment of this application may further include: sending, by the first communications device, the second encoded bit segment to the second communications device.

When a communications system supports re-transmission, the first communications device and the second communications device negotiate about some redundancy versions to be used and which redundancy version is used for each re-transmission. Each redundancy version may be used to indicate a starting position of the second encoded bit segment in the first encoded bit segment. The first communications device obtains the second encoded bit segment from the starting position.

A decoding success rate of the second communications device can be improved by sending a different second encoded bit segment in the first encoded bit segment each time.

To enable lengths of second encoded bit segments sent for different times are similar or the same, starting positions corresponding to different redundancy versions may be distributed in different positions in the first encoded bit segment. Commonly, the positions are equally spaced.

When initially transmitting the first encoded bit segment, the first communications device usually uses a redundancy version $RV_0$, and a starting position $S_0$ of $RV_0$ may be a position of a $p^{th}$ bit in the first encoded bit segment, where p herein is an integer greater than or equal to 0, and the $p^{th}$ bit is the first information bit that is not a to-be-punctured information bit in the first encoded bit segment.

Figure 3:
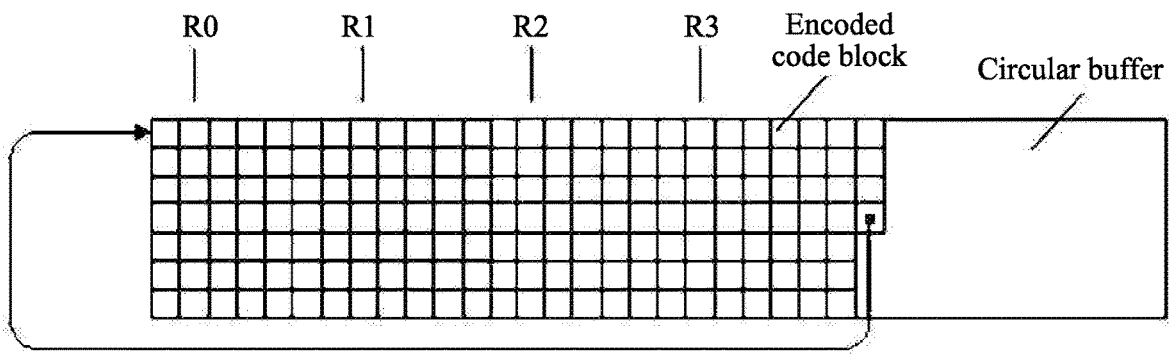
FIG. 3 is a schematic flowchart of obtaining an encoded bit segment in a data processing method according to an embodiment of this application.

A schematic diagram of a first encoded bit segment shown in FIG. 3 is used as an example. A length of the first encoded bit segment in the circular buffer is 179 bits. The first encoded bit segment in the circular buffer includes 7 rows and 26 columns. From a position of column 0 and row 0, a starting position corresponding to $RV_0$ is column 1 and row 0, that is, the 7th bit, a starting position corresponding to $RV_1$ is column 7 and row 0, that is, the $49^{th}$ bit, a starting position corresponding to $RV_2$ is column 13 and row 0, that is, the $91^{st}$ bit, and a starting position corresponding to $RV_3$ is column 19 and row 0, that is, the $133^{th}$ bit. It can be learned that the redundancy versions are equally spaced.

If the used redundancy version is $RV_0$, the first communications device reads an encoded bit segment in column order from column 1, that is, reads, from the $7^{th}$ bit, an encoded bit segment having a length of 42 bits. If the used redundancy version is $RV_3$, the first communications device reads an encoded bit segment in column order from column 19. It should be noted that after reading the last bit, the first communications device further needs to perform reading from a starting position of column 0 and row 0 in the circular buffer, that is, reads an encoded bit segment having a total length of 53 bits. It should be noted that this is merely for ease of example, and this application is not limited thereto.

Figure 4:
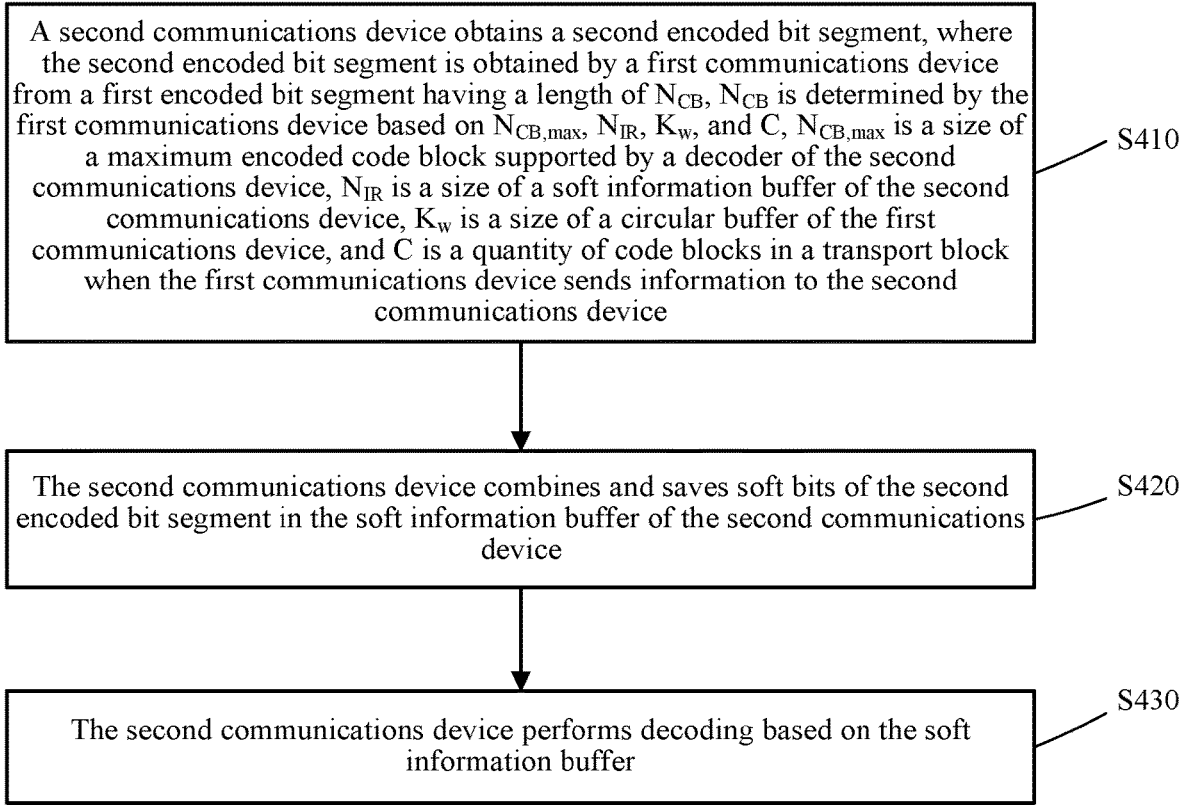
FIG. 4 is a schematic flowchart of a data processing method according to an embodiment of this application.

A schematic flowchart of a data processing method according to another embodiment of this application is shown in FIG. 4. It should be understood that FIG. 4 shows steps or operations of the data processing method, but the steps or operations are merely examples. In this embodiment of this application, other operations or variants of the operations in FIG. 4 may be further performed.

S410. A second communications device obtains a second encoded bit segment, where the second encoded bit segment is obtained by a first communications device from a first encoded bit segment having a length of $N_{CB}$, $N_{CB}$ is determined by the first communications device based on $N_{CB,max}$, $N_{IR}$, $K_W$, and C, $N_{CB,max}$ is a size of a maximum coded block supported by a decoder of the second communications device, $N_{IR}$ is a size of a soft information buffer of the second communications device, $K_W$ is a size of a circular buffer of the first communications device, and C is a quantity of code blocks in a transport block of information transmitted by the first communications device to the second communications device.

S420. The second communications device combines and saves soft bits of the second encoded bit segment in the soft information buffer of the second communications device.

S430. The second communications device performs decoding based on the soft information buffer.

In the data processing method, the length of the first encoded bit segment to which the second encoded bit segment belongs is determined based on $N_{CB,max}$, $N_{IR}$, $K_W$, and C, so that the second communications device can receive soft information having a suitable length, thereby improving communication reliability and reducing decoding complexity of the second communications device.

In this embodiment of this application, $$N_{CB} = \min\left(K_W, N_{CB,max}, \left\lfloor \frac{N_{IR}}{C} \right\rfloor\right).$$

In this embodiment of this application, the first encoded bit segment is an encoded bit segment having a length of $N_{CB}$ in a third encoded bit segment. The third encoded bit segment may be obtained through LDPC encoding.

The third encoded bit segment may include information bits that cannot be punctured. In this case, the first encoded bit segment may also include information bits that cannot be punctured.

The third encoded bit segment may alternatively include to-be-punctured information bits. In this case, the first encoded bit segment may not include to-be-punctured information bits, or may include all or some to-be-punctured information bits.

That the first encoded bit segment does not include some or all to-be-punctured information bits can reduce decoding complexity of the second communications device.

In the data processing method, that a second communications device obtains a second encoded bit segment may include: receiving, by the second communications device, the second encoded bit segment sent by the first communications device.

In the data processing method, the second encoded bit segment may be a bit segment obtained through LDPC encoding.

An execution body of the data processing method in FIG. 4, namely, the second communications device, may be the second communications device in the data processing method in FIG. 2. Therefore, all technical features related to the second communications device in FIG. 2 can be applicable to the second communications device in FIG. 4. For brevity, details are not described herein.

Figure 5:
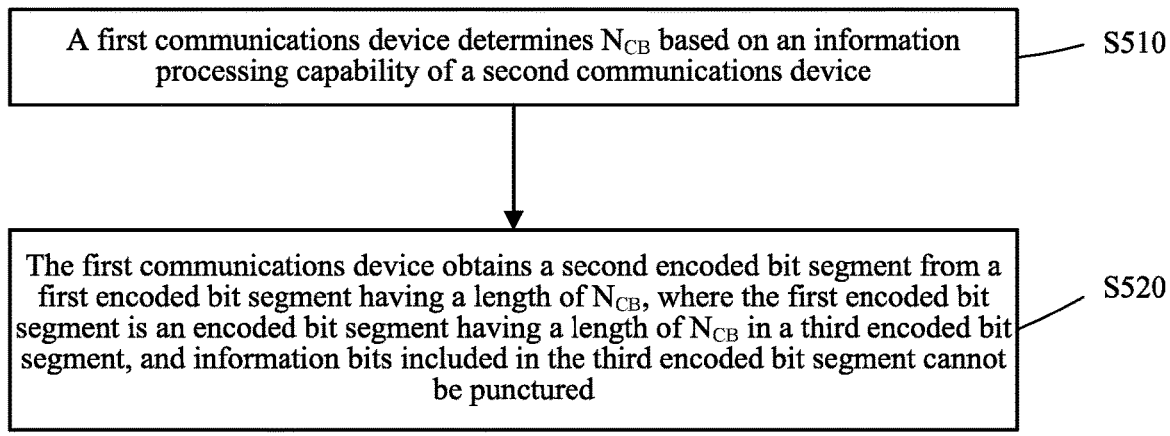
FIG. 5 is a schematic flowchart of a data processing method according to an embodiment of this application.

FIG. 5 is a schematic flowchart of a data processing method according to another embodiment of this application. It should be understood that FIG. 5 shows steps or operations of the data processing method, but the steps or operations are merely examples. In this embodiment of this application, other operations or variants of the operations in FIG. 5 may be further performed.

S510. A first communications device determines $N_{CB}$ based on an information processing capability of a second communications device.

$N_{CB}$ as may also be referred to a size of a soft information buffer actually used when the second communications device receives information sent by the first communications device.

S520. The first communications device obtains a second encoded bit segment from a first encoded bit segment having a length of $N_{CB}$ where the first encoded bit segment is an encoded bit segment having a length of $N_{CB}$ in a third encoded bit segment, and the third encoded bit segment includes information bits that cannot be punctured.

In the data processing method, because the third encoded bit segment includes information bits that cannot be punctured, information bits included in both the first encoded bit segment and the second encoded bit segment cannot be punctured. Therefore, decoding complexity of the second communications device can be reduced.

In addition, the length of the first encoded bit segment is determined based on the information processing capability of the second communications device, thereby improving communication reliability.

In this embodiment of this application, the information processing capability of the second communications device may include a size $N_{CB,max}$ of a maximum coded block supported by a decoder of the second communications device and a size $N_{IR}$ of a soft information buffer of the second communications device. In this case, $$N_{CB} = \min\left(K_W, N_{CB,max}, \left\lfloor \frac{N_{IR}}{C} \right\rfloor\right),$$

where C is a quantity of code blocks in a transport block of information transmitted by the first communications device to the second communications device, and $K_W$ is a size of a circular buffer of the first communications device.

The circular buffer of the first communications device may also be referred to as a virtual buffer, used to store an encoded bit obtained through encoding by the first communications device, for example, through LDPC encoding.

In this embodiment of this application, the information processing capability of the second communications device may include a size $N_{IR}$ of a soft information buffer of the second communications device. In this case, $$N_{CB} = \min\left(K_W, \left\lfloor \frac{N_{IR}}{C} \right\rfloor\right),$$

where C is a quantity of code blocks in a transport block of information transmitted by the first communications device to the second communications device, and $K_W$ is a size of a circular buffer of the first communications device.

In this embodiment of this application, the information processing capability of the second communications device may include a size $N_{CB,max}$ of a maximum coded block supported by a decoder of the second communications device. In this case, $N_{CB}=\min(K_W,N_{CB,max})$, where $K_W$ is a size of a circular buffer of the first communications device.

In this embodiment of this application, for a specific implementation of determining, by the first communications device, the second encoded bit segment from the first encoded bit segment having the length of $N_{CB}$, refer to the specific implementation of obtaining, by the first communications device, the second encoded bit segment from the first encoded bit segment having the length of $N_{CB}$ in FIG. 2. For brevity, details are not described herein.

The data processing method in this embodiment of this application may further include: sending, by the first communications device, the second encoded bit segment to the second communications device.

Figure 6:
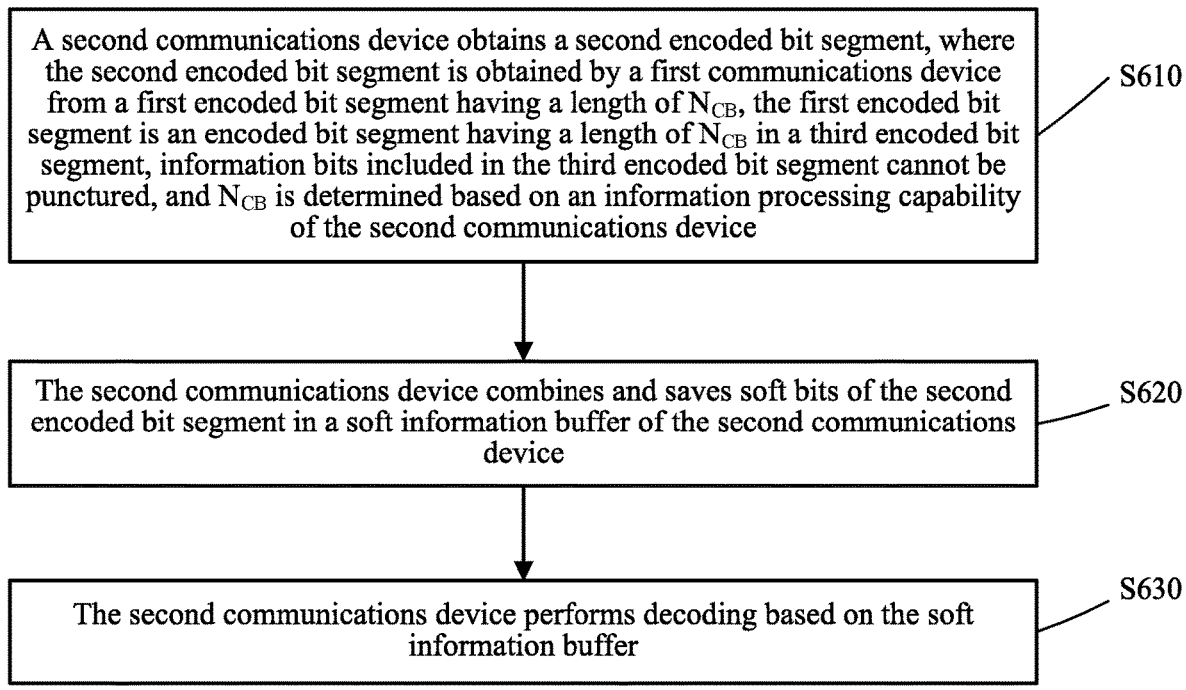
FIG. 6 is a schematic flowchart of a data processing method according to an embodiment of this application.

FIG. 6 is a schematic flowchart of a data processing method according to another embodiment of this application. It should be understood that FIG. 6 shows steps or operations of the data processing method, but the steps or operations are merely examples. In this embodiment of this application, other operations or variants of the operations in FIG. 6 may be further performed.

S610. A second communications device obtains a second encoded bit segment, where the second encoded bit segment is obtained by a first communications device from a first encoded bit segment having a length of $N_{CB}$, the first encoded bit segment is an encoded bit segment having a length of $N_{CB}$ in a third encoded bit segment, the third encoded bit segment includes information bits that cannot be punctured, and $N_{CB}$ is determined based on an information processing capability of the second communications device.

S620. The second communications device combines and saves soft bits of the second encoded bit segment in a soft information buffer of the second communications device.

S630. The second communications device performs decoding based on the soft information buffer.

In the data processing method, because the third encoded bit segment includes information bits that cannot be punctured, information bits included in both the first encoded bit segment and the second encoded bit segment cannot be punctured either, thereby reducing decoding complexity of the second communications device.

In addition, the length of the first encoded bit segment is determined based on the information processing capability of the second communications device, thereby improving communication reliability.

In this embodiment of this application, the information processing capability of the second communications device may include a size $N_{CB,max}$ of a maximum coded block supported by a decoder of the second communications device and a size $N_{IR}$ of the soft information buffer of the second communications device. In this case, $$N_{CB} = \min\left(K_W, N_{CB,max}, \left\lfloor \frac{N_{IR}}{C} \right\rfloor\right),$$

where C is a quantity of code blocks in a transport block of information transmitted by the first communications device to the second communications device, and $K_W$ is a size of a circular buffer of the first communications device.

In this embodiment of this application, the information processing capability of the second communications device may include a size $N_{IR}$ of the soft information buffer of the second communications device. In this case, $$N_{CB} = \min\left(K_W, \left\lfloor \frac{N_{IR}}{C} \right\rfloor\right),$$

where C is a quantity of code blocks in a transport block of information transmitted by the first communications device to the second communications device, and $K_W$ is a size of a circular buffer of the first communications device.

In this embodiment of this application, the information processing capability of the second communications device may include a size $N_{CB,max}$ of a maximum coded block supported by a decoder of the second communications device, where $N_{CB}=\min(K_W, N_{CB,max})$, and $K_W$ is a size of a circular buffer of the first communications device.

In the data processing method in this embodiment of this application, that a second communications device obtains a second encoded bit segment may include: receiving, by the second communications device, the second encoded bit segment sent by the first communications device.

Optionally, the third encoded bit segment may be a bit segment obtained through LDPC encoding.

An execution body of the data processing method in FIG. 6, namely, the second communications device, may be the second communications device in the data processing method in FIG. 5. Therefore, all technical features related to the second communications device in FIG. 5 can be applicable to the second communications device in FIG. 6. For brevity, details are not described herein.

Figure 7:
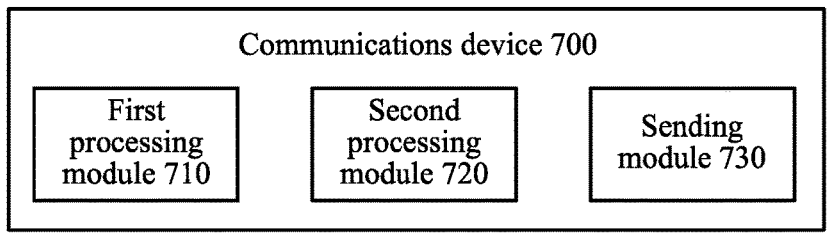
FIG. 7 is a structural diagram of a communications device according to an embodiment of this application.

FIG. 7 is a schematic structural diagram of a communications device 700 according to an embodiment of this application. It should be understood that the communications device 700 shown in FIG. 7 is merely an example. The communications device 700 in this embodiment of this application may further include other modules or units, or may include modules having functions similar to those of modules in FIG. 7, or may not necessarily include all modules in FIG. 7.

A first processing module 710 is configured to determine $N_{CB}$, where $N_{CB}$ is determined based on $N_{CB,max}$, $N_{IR}$, $K_W$, and C, $N_{CB,max}$ is a size of a maximum coded block supported by a decoder of a second communications device, $N_{IR}$ is a size of a soft information buffer of the second communications device, $K_W$ is a size of a circular buffer of the communications device, and C is a quantity of code blocks in a transport block of information transmitted by the communications device to the second communications device.

A second processing module 720 is configured to obtain a second encoded bit segment from a first encoded bit segment having a length of $N_{CB}$.

A second encoded bit segment sent by the communications device 700 to each second communications device is obtained from the first encoded bit segment, and the length $N_{CB}$ of the first encoded bit segment is determined based on the size of the circular buffer of the communications device and an information processing capability of the second communications device, thereby reducing storage overheads and decoding complexity of the second communications device.

The communications device 700 determines sizes of first encoded bit segments corresponding to different second communications devices respectively based on information processing capabilities of the different second communications devices. Therefore, communication reliability can be improved.

Optionally, $$N_{CB} = \min\left(K_W, N_{CB,max}, \left\lfloor \frac{N_{IR}}{C} \right\rfloor\right).$$

Optionally, the first encoded bit segment is an encoded bit segment having a length of $N_{CB}$ in a third encoded bit segment, and the third encoded bit segment includes information bits that cannot be punctured.

Optionally, the first encoded bit segment is an encoded bit segment having a length of $N_{CB}$ in a third encoded bit segment, the third encoded bit segment includes to-be-punctured information bits, the to-be-punctured information bits are located at a tail of the third encoded bit segment, the first encoded bit segment is located at beginning of the third encoded bit segment, and the first encoded bit segment includes some of the to-be-punctured information bits.

Optionally, the first encoded bit segment is an encoded bit segment having a length of $N_{CB}$ in a third encoded bit segment, the third encoded bit segment includes to-be-punctured information bits, the to-be-punctured information bits are located at a tail of the third encoded bit segment, the first encoded bit segment is located at beginning of the third encoded bit segment, and the first encoded bit segment does not include any to-be-punctured information bit.

Optionally, the second processing module 720 is specifically configured to: determine a first starting position in the first encoded bit segment; and obtain, as the second encoded bit segment, an encoded bit segment having a length of n from the first starting position in the first encoded bit segment, where n is a positive integer.

Optionally, the communications device 700 further includes a sending module 730, configured to send the second encoded bit segment to the second communications device.

Optionally, the second encoded bit segment is a bit segment obtained through low-density parity-check LDPC encoding. In this case, the communications device may further include an encoding module, configured to perform LDPC encoding, to obtain the third encoded bit segment. The encoding module may also be referred to as an encoder.

It should be understood that the foregoing and other operations and/or functions of the units of the communications device 700 in this embodiment of this application shown in FIG. 7 are respectively used to implement corresponding procedures performed by the first communications device in the communication method in FIG. 2. For brevity, details are not described herein.

Figure 8:
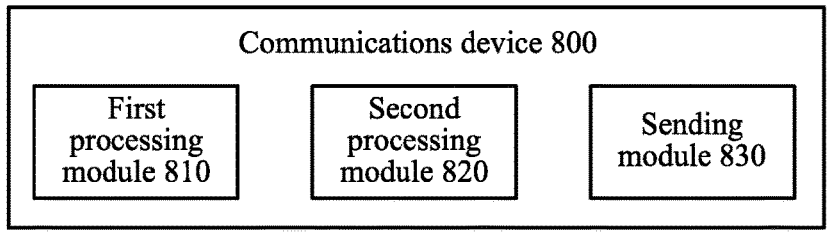
FIG. 8 is a structural diagram of a communications device according to an embodiment of this application.

FIG. 8 is a schematic structural diagram of a communications device 800 according to another embodiment of this application. It should be understood that the communications device 800 shown in FIG. 8 is merely an example. The communications device 800 in this embodiment of this application may further include other modules or units, or may include modules having functions similar to those of modules in FIG. 8, or may not necessarily include all modules in FIG. 8.

A first processing module 810 is configured to determine $N_{CB}$ based on an information processing capability of a second communications device.

A second processing module 820 is configured to obtain a second encoded bit segment from a first encoded bit segment having a length of $N_{CB}$, where the first encoded bit segment is an encoded bit segment having a length of $N_{CB}$ in a third encoded bit segment, and the third encoded bit segment includes information bits that cannot be punctured.

In the data processing method, the third encoded bit segment does not include to-be-punctured information bits. Therefore, complexity of determining the first encoded bit segment from the third encoded bit segment by the communications device 800 can be reduced.

In addition, because the third encoded bit segment does not include to-be-punctured information bits, neither the first encoded bit segment nor the second encoded bit segment includes to-be-punctured information bits, thereby reducing decoding complexity of the second communications device.

In addition, the length of the first encoded bit segment is determined based on the information processing capability of the second communications device, thereby improving communication reliability.

Optionally, the information processing capability of the second communications device may include a size $N_{CB,max}$ of a maximum coded block supported by a decoder of the second communications device and a size $N_{IR}$ of a soft information buffer of the second communications device. In this case, $$N_{CB} = \min\left(K_W, N_{CB,max}, \left\lfloor \frac{N_{IR}}{C} \right\rfloor\right),$$

where C is a quantity of code blocks in a transport block of information transmitted by the communications device 800 to the second communications device, and $K_W$ is a size of a circular buffer of the communications device.

Optionally, the information processing capability of the second communications device may include a size $N_{IR}$ of a soft information buffer of the second communications device. In this case, $$N_{CB} = \min\left(K_W, \left\lfloor \frac{N_{IR}}{C} \right\rfloor\right),$$

where C is a quantity of code blocks in a transport block of information transmitted by the communications device 800 to the second communications device, and $K_W$ is a size of a circular buffer of the communications device.

Optionally, the information processing capability of the second communications device may include a size $N_{CB,max}$ of a maximum coded block supported by a decoder of the second communications device, where $N_{CB}=\min(K_W, N_{CB,max})$, and $K_W$ is a size of a circular buffer of the communications device.

Optionally, the communications device 800 further includes a sending module 830, configured to send the second encoded bit segment to the second communications device.

Optionally, the second encoded bit segment is a bit segment obtained through low-density parity-check LDPC encoding. In this case, the communications device 800 may further include an encoding module, configured to perform LDPC encoding, to obtain the third encoded bit segment. The encoding module may also be referred to as an encoder.

It should be understood that the foregoing and other operations and/or functions of the units of the communications device 800 in this embodiment of this application shown in FIG. 8 are respectively used to implement corresponding procedures performed by the first communications device in the communication method in FIG. 5. For brevity, details are not described herein.

Figure 9:
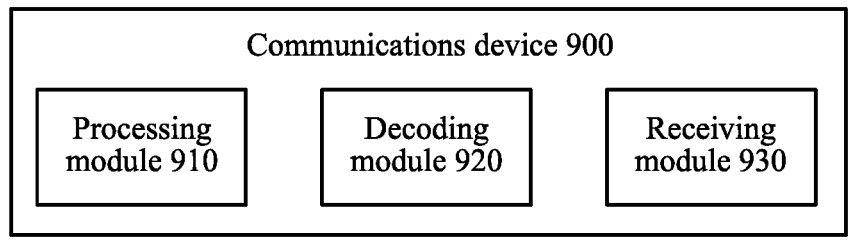
FIG. 9 is a structural diagram of a communications device according to an embodiment of this application.

FIG. 9 is a schematic structural diagram of a communications device 900 according to another embodiment of this application. It should be understood that the communications device 900 shown in FIG. 9 is merely an example. The communications device 900 in this embodiment of this application may further include other modules or units, or may include modules having functions similar to those of modules in FIG. 9, or may not necessarily include all modules in FIG. 9.

A processing module 910 is configured to obtain a second encoded bit segment, where the second encoded bit segment is obtained by a first communications device from a first encoded bit segment having a length of $N_{CB}$, $N_{CB}$ is determined by the first communications device based on $N_{CB,max}$, $N_{IR}$, $K_W$, and C, $N_{CB,max}$ is a size of a maximum coded block supported by a decoder of the communications device 900, $N_{IR}$ is a size of a soft information buffer of the communications device 900, $K_W$ is a size of a circular buffer of the first communications device, and C is a quantity of code blocks in a transport block of information transmitted by the first communications device to the communications device 900.

The processing module 910 is further configured to combine and save soft bits of the second encoded bit segment in the soft information buffer of the communications device 900.

A decoding module 920 is configured to perform decoding based on the soft information buffer.

The length of the first encoded bit segment to which the second encoded bit segment obtained by the communications device 900 belongs is determined based on $N_{CB,max}$, $N_{IR}$, $K_W$, and C, so that the communications device 900 can receive soft information having a suitable length, thereby improving communication reliability and reducing decoding complexity of the communications device.

Optionally, $$N_{CB} = \min\left(K_W, N_{CB,max}, \left\lfloor \frac{N_{IR}}{C} \right\rfloor\right).$$

Optionally, the communications device 900 may further include a receiving module 930, configured to receive the second encoded bit segment.

Optionally, the second encoded bit segment is a bit segment obtained through LDPC encoding.

It should be understood that the foregoing and other operations and/or functions of the units of the communications device 900 in this embodiment of this application shown in FIG. 9 are respectively used to implement corresponding procedures performed by the second communications device in the communication method in FIG. 4. For brevity, details are not described herein.

Figure 10:
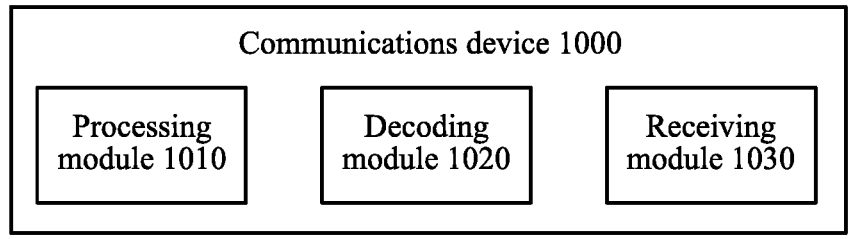
FIG. 10 is a structural diagram of a communications device according to an embodiment of this application.

FIG. 10 is a schematic structural diagram of a communications device 1000 according to another embodiment of this application. It should be understood that the communications device 1000 shown in FIG. 10 is merely an example. The communications device 1000 in this embodiment of this application may further include other modules or units, or may include modules having functions similar to those of modules in FIG. 10, or may not necessarily include all modules in FIG. 10.

A processing module 1010 is configured to obtain a second encoded bit segment, where the second encoded bit segment is obtained by a first communications device from a first encoded bit segment having a length of $N_{CB}$, the first encoded bit segment is an encoded bit segment having a length of $N_{CB}$ in a third encoded bit segment, the third encoded bit segment includes information bits that cannot be punctured, and $N_{CB}$ is determined based on an information processing capability of the communications device 1000.

The processing module 1010 is further configured to combine and save soft bits of the second encoded bit segment in a soft information buffer of the communications device 1000.

A decoding module 1020 is configured to perform decoding based on the soft information buffer.

Because the third encoded bit segment received by the communications device 1000 does not include to-be-punctured information bits, neither the first encoded bit segment nor the second encoded bit segment includes to-be-punctured information bits, thereby reducing decoding complexity of the communications device 1000.

In addition, the length of the first encoded bit segment is determined based on the information processing capability of the communications device 1000, thereby improving communication reliability.

Optionally, the information processing capability of the communications device 1000 may include a size $N_{CB,max}$ of a maximum coded block supported by a decoder of the communications device and a size $N_{IR}$ of the soft information buffer of the communications device 1000. In this case, $$N_{CB} = \min\left(K_W, N_{CB,max}, \left\lfloor \frac{N_{IR}}{C} \right\rfloor\right),$$

where C is a quantity of code blocks in a transport block of information transmitted by the first communications device to the communications device 1000, and $K_W$ is a size of a circular buffer of the first communications device.

Optionally, the information processing capability of the communications device 1000 may include a size $N_{IR}$ of the soft information buffer of the communications device 1000. In this case, $$N_{CB} = \min\left(K_W, \left\lfloor \frac{N_{IR}}{C} \right\rfloor\right),$$

where C is a quantity of code blocks in a transport block of information transmitted by the first communications device to the communications device 1000, and $K_W$ is a size of a circular buffer of the first communications device.

Optionally, the information processing capability of the communications device 1000 may include a size $N_{CB,max}$ of a maximum coded block supported by a decoder of the communications device 1000. In this case, $N_{CB}=\min(K_W, N_{CB,max})$, where $K_W$ is a size of a circular buffer of the first communications device.

Optionally, the communications device 1000 may further include a receiving module 1030, configured to receive the second encoded bit segment.

Optionally, the second encoded bit segment is a bit segment obtained through LDPC encoding.

It should be understood that the foregoing and other operations and/or functions of the units of the communications device 1000 in this embodiment of this application shown in FIG. 10 are respectively used to implement corresponding procedures performed by the second communications device in the communication method in FIG. 6. For brevity, details are not described herein.

Figure 11:
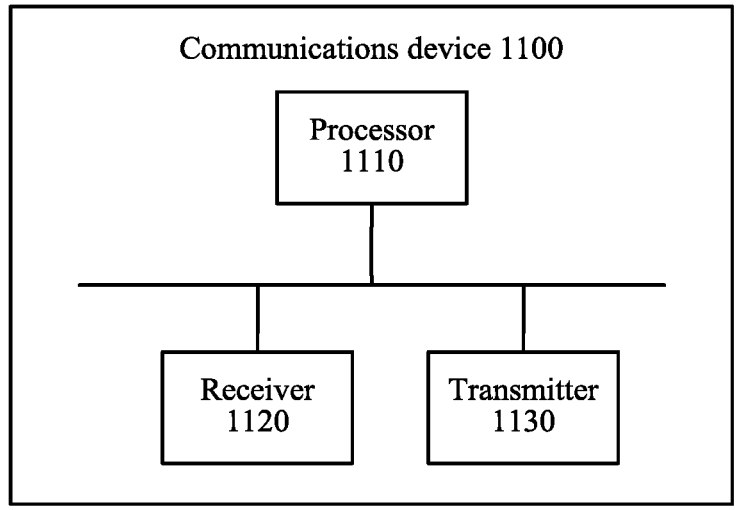
FIG. 11 is a structural diagram of a communications device according to an embodiment of this application.

FIG. 11 is a schematic structural diagram of a communications device 1100 according to another embodiment of this application. It should be understood that the communications device 1100 shown in FIG. 11 is merely an example. The communications device 1100 in this embodiment of this application may further include other modules or units, or may include modules having functions similar to those of modules in FIG. 11, or may not necessarily include all modules in FIG. 11.

A processor 1110 may be configured to implement operations or steps that can be implemented by the first processing module 710 and the second processing module 720 in FIG. 7, and a transmitter 1130 may be configured to implement operations or steps that can be implemented by the sending module 730 in FIG. 7. For brevity, details are not described herein.

Optionally, the communications device 1100 may further include a receiver 1120, configured to receive information sent by another device.

The processor 1110 may be integrated with a memory.

Figure 12:
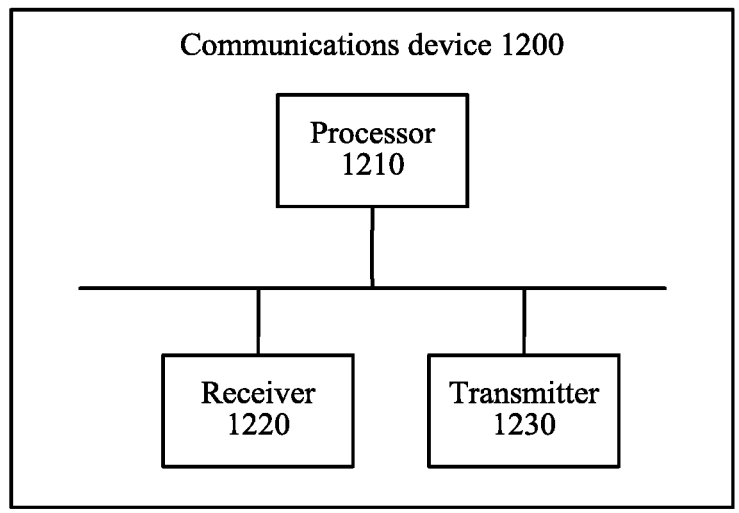
FIG. 12 is a structural diagram of a communications device according to an embodiment of this application.

FIG. 12 is a schematic structural diagram of a communications device 1200 according to another embodiment of this application. It should be understood that the communications device 1200 shown in FIG. 12 is merely an example. The communications device 1200 in this embodiment of this application may further include other modules or units, or may include modules having functions similar to those of modules in FIG. 12, or may not necessarily include all modules in FIG. 12.

A processor 1210 may be configured to implement operations or steps that can be implemented by the first processing module 810 and the second processing module 820 in FIG. 8, and a transmitter 1230 may be configured to implement operations or steps that can be implemented by the sending module 830 in FIG. 8. For brevity, details are not described herein.

Optionally, the communications device 1200 may further include a receiver 1220, configured to receive information sent by another device.

The processor 1210 may be integrated with a memory.

Figure 13:
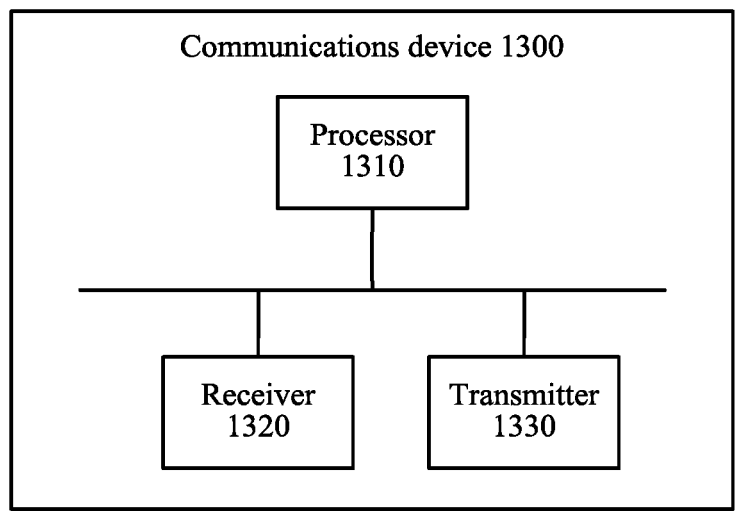
FIG. 13 is a structural diagram of a communications device according to an embodiment of this application.

FIG. 13 is a schematic structural diagram of a communications device 1300 according to another embodiment of this application. It should be understood that the communications device 1300 shown in FIG. 13 is merely an example. The communications device 1300 in this embodiment of this application may further include other modules or units, or may include modules having functions similar to those of modules in FIG. 13, or may not necessarily include all modules in FIG. 13.

A processor 1310 may be configured to implement operations or steps that can be implemented by the decoding module 920 and the processing module 910 in FIG. 9, and a receiver 1320 may be configured to implement operations or steps that can be implemented by the receiving module 930 in FIG. 9. For brevity, details are not described herein.

Optionally, the communications device 1300 may further include a transmitter 1330, configured to send information to another device.

The processor 1310 may be integrated with a memory.

Figure 14:
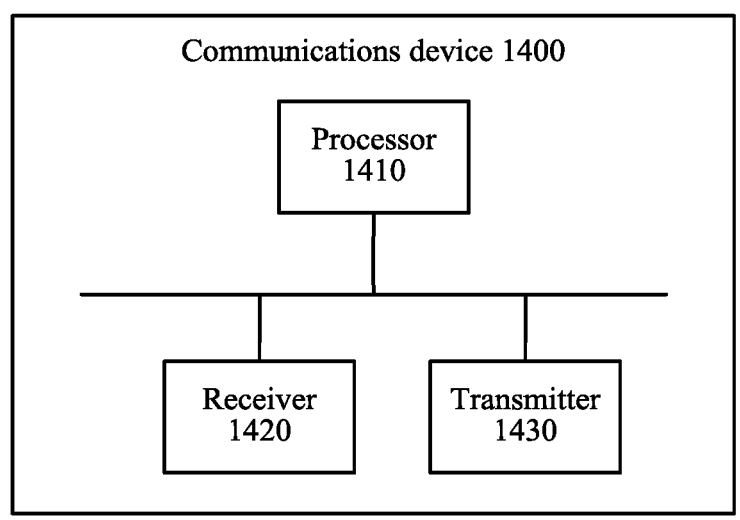
FIG. 14 is a structural diagram of a communications device according to an embodiment of this application.

FIG. 14 is a schematic structural diagram of a communications device 1400 according to another embodiment of this application. It should be understood that the communications device 1400 shown in FIG. 14 is merely an example. The communications device 1400 in this embodiment of this application may further include other modules or units, or may include modules having functions similar to those of modules in FIG. 14, or may not necessarily include all modules in FIG. 14.

A processor 1410 may be configured to implement operations or steps that can be implemented by the decoding module 1020 and the processing module 1010 in FIG. 10, and a receiver 1420 may be configured to implement operations or steps that can be implemented by the receiving module 1030 in FIG. 10. For brevity, details are not described herein.

Optionally, the communications device 1400 may further include a transmitter 1430, configured to send information to another device.

The processor 1410 may be integrated with a memory.

A person of ordinary skill in the art may be aware that in combination with the examples described in the embodiments disclosed in this specification, units and algorithm steps may be implemented by electronic hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of this application.

It may be clearly understood by a person skilled in the art that for the purpose of convenient and brief description, for a detailed working process of the foregoing system, apparatuses, and units, reference may be made to a corresponding process in the foregoing method embodiments, and details are not described herein.

In the several embodiments provided in this application, it should be understood that the disclosed system, apparatuses, and methods may be implemented in other manners. For example, the described apparatus embodiments are merely examples. For example, the unit division is merely logical function division and may be other division in actual implementation. For example, a plurality of units or components may be combined or integrated into another system, or some features may be ignored or may not be performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of this application essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of this application. The foregoing storage medium includes any medium that can store program code, for example, a USB flash drive, a removable hard disk, a read-only memory (ROM), a random access memory (RAM), a magnetic disk, or a compact disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A data processing method comprising:
saving, by a first communications device, a third encoded bit segment in a circular buffer of the first communications device, wherein the third encoded bit segment is a bit segment obtained by encoding a code block based on a low-density parity-check (LDPC) parity check matrix, the third encoded bit segment does not comprise a first to-be-punctured bit segment, the LDPC parity check matrix comprises a puncture column, and the first to-be-punctured bit segment comprises information bits associated with the puncture column;
determining, by the first communications device, a first encoded bit segment having a length of $N_{CB}$ from the third encoded bit segment, wherein $N_{CB}$ is determined based on a size of the circular buffer of the first communications device and an information processing capability of a second communications device; and obtaining, by the first communications device, a second encoded bit segment from the first encoded bit segment.

2. The data processing method according to claim 1, wherein the information processing capability of the second communications device comprises a size $N_{IR}$ of a soft information buffer of the second communications device, wherein $$N_{CB} = \min\left(K_W, \left\lfloor \frac{N_{IR}}{C} \right\rfloor\right),$$

C is a quantity of code blocks in a transport block of information transmitted by the first communications device to the second communications device, and $K_W$ is the size of the circular buffer of the first communications device; or the information processing capability of the second communications device comprises a size $N_{CB,max}$ of a maximum coded block supported by a decoder of the second communications device and a size $N_{IR}$ of a soft information buffer of the second communications device, wherein $$N_{CB} = \min\left(K_W, N_{CB,max}, \left\lfloor \frac{N_{IR}}{C} \right\rfloor\right),$$

C is a quantity of code blocks in a transport block of information transmitted by the first communications device to the second communications device, and $K_W$ is the size of the circular buffer of the first communications device.

3. The data processing method according to claim 1, wherein obtaining the second encoded bit segment from the first encoded bit segment comprises:

determining, by the first communications device, a first starting position in the first encoded bit segment based on a sent redundancy version; and obtaining, by the first communications device as the second encoded bit segment, an encoded bit segment having a length of n from the first starting position in the first encoded bit segment, wherein n is a positive integer.

4. The data processing method according to claim 1, wherein the second encoded bit segment does not comprise filler bits.

5. The data processing method according to claim 1, further comprising:

performing, by the first communications device, interleaving on the second encoded bit segment to obtain an interleaved encoded bit segment; and performing, by the first communications device, modulation on the interleaved encoded bit segment to obtain modulation symbols.

6. The data processing method according to claim 5, further comprising:

sending, by the first communications device to the second communications device, the modulation symbols.

7. A communications device, comprising:
a processor; and
a non-transitory computer-readable storage medium coupled to the processor and storing processor-executable programming instructions, which when executed by the processor, cause the processor to:

save a third encoded bit segment in a circular buffer of the communications device, wherein the third encoded bit segment is a bit segment obtained through encoding based on a low-density parity-check (LDPC) parity check matrix, the third encoded bit segment does not comprise a first to-be-punctured bit segment, the LDPC parity check matrix comprises a puncture column, and the first to-be-punctured bit segment comprises information bits associated with the punctured column;

determine $N_{CB}$ based on a size of the circular buffer of the communications device and an information processing capability of a second communications device;

determine a first encoded bit segment having a length of $N_{CB}$ from the third encoded bit segment; and obtain a second encoded bit segment from the first encoded bit segment.

8. The communications device according to claim 7, wherein the information processing capability of the second communications device comprises a size $N_{IR}$ of a soft information buffer of the second communications device, wherein $$N_{CB} = \min\left(K_W, \left\lfloor \frac{N_{IR}}{C} \right\rfloor\right),$$

C is a quantity of code blocks in a transport block of information transmitted by the communications device to the second communications device, and $K_W$ is the size of the circular buffer of the communications device; or the information processing capability of the second communications device comprises a size $N_{CB,max}$ of a maximum coded block supported by a decoder of the second communications device and a size $N_{IR}$ of a soft information buffer of the second communications device, wherein $$N_{CB} = \min\left(K_W, N_{CB,max}, \left\lfloor \frac{N_{IR}}{C} \right\rfloor\right),$$

C is a quantity of code blocks in a transport block of information transmitted by the communications device to the second communications device, and $K_W$ is the size of the circular buffer of the communications device; or the information processing capability of the second communications device comprises a size $N_{CB,max}$ of a maximum coded block supported by a decoder of the second communications device, wherein $N_{CB}=\min(K_W, N_{CB,max})$, and $K_W$ is the size of the circular buffer of the communications device.

9. The communications device according to claim 7, wherein the processor-executable programming instructions further cause the processor to:

determine a first starting position in the first encoded bit segment based on a sent redundancy version; and obtain, as the second encoded bit segment, an encoded bit segment having a length of n from the first starting position in the first encoded bit segment, wherein n is a positive integer.

10. The communications device according to claim 7, wherein the second encoded bit segment does not comprise filler bits.

11. The communications device according to claim 7, wherein the processor-executable programming instructions further cause the processor to:
perform interleaving on the second encoded bit segment to obtain a interleaved encoded bit segment; and
perform modulation on the interleaved encoded bit segment to obtain modulation symbols.

12. The communications device according to claim 11, further comprising a transmitter, configured to cooperate with the processor to send the modulation symbols.

13. The communications device according to claim 12, wherein the communications device is a terminal or a base station.

14. A non-transitory computer-readable storage medium, having processor-executable instructions stored thereon, which when executed by a processor of a computer, cause the computer to perform operations including:
saving a third encoded bit segment in a circular buffer of a communications device, wherein the third encoded bit segment is a bit segment obtained through encoding based on a low-density parity-check (LDPC) parity check matrix, the third encoded bit segment does not comprise a first to-be-punctured bit segment, the LDPC parity check matrix comprises one or more puncture columns, and the first to-be-punctured bit segment comprises information bits associated with the one or more punctured columns;
determining $N_{CB}$ based on a size of the circular buffer of the communications device and an information processing capability of a second communications device;
determining a first encoded bit segment having a length of $N_{CB}$ from the third encoded bit segment; and
obtaining a second encoded bit segment from the first encoded bit segment.

15. The non-transitory computer-readable storage medium according to claim 14, wherein the information processing capability of the second communications device comprises a size $N_{IR}$ of a soft information buffer of the second communications device, wherein $$N_{CB} = \min\left(K_W, \left\lfloor \frac{N_{IR}}{C} \right\rfloor\right),$$

C is a quantity of code blocks in a transport block of information transmitted by the communications device to the second communications device, and $K_W$ is the size of the circular buffer of the communications device; or
the information processing capability of the second communications device comprises a size $N_{CB,max}$ of a maximum coded block supported by a decoder of the second communications device and a size $N_{IR}$ of a soft information buffer of the second communications device, wherein $$N_{CB} = \min\left(K_W, N_{CB,max}, \left\lfloor \frac{N_{IR}}{C} \right\rfloor\right),$$

C is a quantity of code blocks in a transport block of information transmitted by the communications device to the second communications device, and $K_W$ is the size of the circular buffer of the communications device; or
the information processing capability of the second communications device comprises a size $N_{CB,max}$ of a maximum coded block supported by a decoder of the second communications device, wherein $N_{CB}$=min$(K_W, N_{CB,max})$, and $K_W$ is the size of the circular buffer of the communications device.

16. The non-transitory computer-readable storage medium according to claim 14, wherein the operation of obtaining the second encoded bit segment from the first encoded bit segment comprising:
determining a first starting position in the first encoded bit segment based on a sent redundancy version; and
obtaining, as the second encoded bit segment, an encoded bit segment having a length of n from the first starting position in the first encoded bit segment, wherein n is a positive integer.

17. The non-transitory computer-readable storage medium according to claim 14, wherein the second encoded bit segment does not comprise filler bits.

18. The non-transitory computer-readable storage medium according to claim 14, wherein the operations further comprise:
performing interleaving on the second encoded bit segment to obtain a interleaved encoded bit segment; and
performing modulation on the interleaved encoded bit segment to obtain modulation symbols.

19. The non-transitory computer-readable storage medium according to claim 18, wherein the operations further comprise:
sending the modulation symbols.

20. The data processing method according to claim 1, wherein
the information processing capability of the second communications device comprises a size $N_{CB,max}$ of a maximum coded block supported by a decoder of the second communications device, wherein $N_{CB}$=min$(K_W, N_{CB,max})$, and $K_W$ is the size of the circular buffer of the first communications device.

* * * * *